United States Patent [19]

Boylan et al.

[11] Patent Number: 4,847,138
[45] Date of Patent: Jul. 11, 1989

[54] THERMAL WRITING ON GLASS AND GLASS-CERAMIC SUBSTRATES

[75] Inventors: Elizabeth A. Boylan, Corning; Gerald D. Fong, Beaver Dams, both of N.Y.

[73] Assignee: Corning Glass Works, Corning, N.Y.

[21] Appl. No.: 105,263

[22] Filed: Oct. 7, 1987

[51] Int. Cl.$^4$ .................................................. B32B 3/00
[52] U.S. Cl. ........................................ 428/209; 428/409; 428/426; 428/432; 428/901; 430/41; 430/198; 430/322; 430/945; 430/967; 427/53.1; 427/96; 29/851; 148/DIG. 92; 148/DIG. 93; 65/21.1; 65/30.11
[58] Field of Search ................. 430/41, 198, 322, 945, 430/967; 427/96, 53.1; 65/21.1, 30.11; 148/DIG. 92, DIG. 93; 29/851; 428/209, 426, 432, 409, 901

[56] References Cited

U.S. PATENT DOCUMENTS

| | | | |
|---|---|---|---|
| 3,420,645 | 1/1969 | Hair | 65/21.1 |
| 3,464,806 | 9/1969 | Seki et al. | 65/32 |
| 3,490,887 | 1/1970 | Herczog et al. | 65/33 |
| 3,649,392 | 3/1972 | Schneck | 156/3 |
| 3,824,100 | 7/1974 | Griest | 96/27 R |
| 3,900,593 | 8/1975 | Herczog et al. | 427/53.1 |
| 4,065,656 | 12/1977 | Brown-Morgan | 219/121 LM |
| 4,372,989 | 2/1983 | Menzel | 427/53.1 |
| 4,666,552 | 5/1987 | Baeuerle | 156/643 |
| 4,681,778 | 7/1987 | Young | 427/96 |
| 4,684,446 | 8/1987 | Charles et al. | 204/15 |

FOREIGN PATENT DOCUMENTS 944571 12/1963 United Kingdom .

OTHER PUBLICATIONS

Segregation Effects in Cu-Implanted Si After Laser--Pulse Melting, Baeri et al., Physical Review Letters, Oct. 30, 1988, vol. 41, No. 18, pp. 1246–1249.

Kanichi Kamiya et al., Migration of Cu+ Ions in Cu$_2$O—Al$_2$O$_3$—SiO$_2$ Glasses on Heating in Air—1986—Pertinent pp. 405–411.

*Primary Examiner*—Ellis P. Robinson
*Assistant Examiner*—P. J. Ryan
*Attorney, Agent, or Firm*—Clinton S. Janes, Jr.

[57] ABSTRACT

There is disclosed a method of producing a transition metal pattern on a glass or glass-ceramic substrate by selective exudation of a transition metal from a glass substrate containing the metal as an oxide. The selective exudation is effected by applying an intense, well-focused source of energy to a glass in a pattern corresponding to the desired metal pattern. This develops localized heating, and thereby causes corresponding localized metal exudation from the glass. The metal pattern may be rendered electroconductive, and may constitute a pattern of interconnecting lines for microcircuitry.

31 Claims, 1 Drawing Sheet

THERMAL WRITING ON GLASS AND GLASS-CERAMIC SUBSTRATES

RELATED APPLICATION

An application, filed of even date herewith in the names of G. D. Fong and S. L. Hultman and entitled "Copper-Exuding, Boroaluminosilicate Glasses", discloses and claims a family of low dielectric glasses. These glasses are adapted to use in accordance with the method of the subject application, as well as being compatible with silicon in such applications as integrated circuits.

INTRODUCTION

This invention is concerned with glass or glass-ceramic substrates having a transition metal pattern formed on their surfaces. It is further concerned with a method of producing such a pattern by thermal exudation of a metal from the substrate. The invention is particularly concerned with an electroconductive pattern composed of fine lines that finds application in the field of microcircuits. Other applications that require precise location of fine lines include precision grids and scales for instrumentation.

The trend in electronic devices generally, and microcircuitry in particular, is to continuously increase density while decreasing, or miniaturizing, the size of the device and, consequently, the substrate surface. This require forming ever greater numbers of interconnecting leads on a smaller surface. The apparent need then is for extremely narrow interconnections that have uniform continuity, and that have precise spatial separation.

PURPOSES OF THE INVENTION

A basic purpose is provision of a pattern of spaced metal elements on a glass or glass-ceramic substrate surface.

A further purpose is to provide a unique method of producing a metal pattern on a glass or glass-ceramic surface.

Another purpose is to provide a metal pattern composed of spatially separated, fine lines on a glass or glass-ceramic substrate.

A still further purpose is to produce such a pattern with greater precision and finer lines than previously available.

Still another purpose is to produce electronic devices having leads interconnected by very fine, electroconductive, metal lines.

A further purpose is to produce a metal pattern on a glass or glass-ceramic surface by a simple thermal treatment.

Another purpose is to produce metal circuit lines less than 2 mils (0.08 micron) in width.

PRIOR LITERATURE

U.S. Pat. No. 3,420,645 (Hair) discloses a method of making a hollow glass article having a metallic copper coating. Solid particles of a $CuO-Al_2O_3-SiO_2$ glass are heated in a hydrogen-containing atmosphere to expand the particles and cause metallic copper to form on their surfaces.

U.S. Pat. No. 3,464,806 (Seki et al.) and British Pat. No. 944,571 (McMillan et al.) describe producing a copper or silver metallized glass-ceramic. A nucleating agent, and copper or silver oxide, are included in a cerammable glass, and the glass heated on a controlled cycle in a reducing atmosphere.

U.S. Pat. No. 3,490,887 (Herczog et al.) discloses outward migration of copper ions in a ferro-electric glass-ceramic by controlled heat treatment. The copper ions oxidize at the surface to form an oxide layer that can be reduced to metallic copper by firing in hydrogen.

Kamiya et al., *Journal of Non-Crystalline Solids*, 80 (1986) 405–411, describe studies on the behavior of copper ions in $CuO-Al_2O_3-SiO_2$ glasses heated in air.

U.S. Pat. No. 3,900,593 (Herczog et al.) discloses bonding a magnetic metal oxide film to a substrate by localized heating with a focused light source.

U.S. Pat. No. 4,065,656 (Brown et al.), and patents disclosed therein, describe use of a laser beam to spiral resistance elements.

U.S. Pat. No. 4,681,778 (Young) discloses a method and apparatus for making electrical connections between conductors on a substrate. A dielectric-like film is deposited on the substrate in the form of spaced islands. These may be melted by localized heating, for example a laser, to render the film conductive.

U.S. Pat. Nos. 3,649,392 (Schneck) and 3,824,100 (Griest) exemplify circuit forming methods iinvolving chemical etching.

U.S. Pat. No. 4,666,552 (Baeuerle) discloses etching dielectric oxide ceramics and single crystal oxides by means of laser radiation in an atmosphere having a reducing effect on the oxide materials.

STATEMENT OF THE INVENTION

In furtherance of these and other apparent purposes, our invention is a method of producing a desired metallic pattern of a selected transition metal on the surface of a glass or glass-ceramic substrate which comprises the steps of:

(a) providing a glass substrate having a composition containing an oxide of said selected transition metal and which is capable of exuding said selected transition metal onto the surface of said glass when subjected to thermal influence; and then (b) applying an intense, well-focused source of energy onto the surface of said glass substrate in the form of the pattern desired for said selected transition metal in order to develop localized heating in the surface of said substrate and thereby cause said selected transition metal to exude onto the surface of said glass substrate in said desired metallic pattern.

In one specific embodiment, the pattern is composed of spatially-separated, fine lines serving as lead interconnections on an electronic device such as a microcircuit. A preferred metal is copper. A preferred source of energy is a laser beam employed in conjunction with a glass containing an oxide that absorbs the light energy from the laser beam and converts it to thermal energy.

GENERAL DESCRIPTION OF THE INVENTION

The invention is based in part of the discovery that a transition metal can be selectively exuded onto predetermined portions of a glass surface in a very precisely controlled manner by thermally exciting the predetermined portions. Thus, very fine metal lines may be traced on the surface of a glass that is capable of thermally exuding the metal. The metal may appear directly, that is as metal, in some circumstances. It may also appear wholly, or in part, as the oxide. In that case, reduction to the metal may be employed.

Previous disclosures, related to overall thermal treatment of glasses capable of thermal exudation, have generally reported oxide films, such as a grey-black, copper oxide film. Thus, it was surprising to encounter direct exudation of metal, rather than oxide, despite a high concentration of oxygen, as in the presence of air.

It is our belief that this surprising metal formation occurs through a combination of (1) the absorption of high local energy densities, such as created by a focused laser, and (2) the intrinsically low thermal conductivity of the glass. Under these conditions, local temperatures on the glass surface may meet or exceed the temperature necessary to promote decomposition of initially formed oxides to elemental oxygen and metal. Such conditions are a function of both input laser power, $P$, and rastering rate, $R$.

It has been observed that the production and character of metal-containing lines do not appear correlated with the total energy, $E$, absorbed per unit length of application. However, the rate of energy input, either as $P$ or $R$, is obviously important. It appears then that heat loss, e.g. into the glass, is a determining role in metal formation. Thus, the low heat loss in glass is significant.

It has further been noted that, if the thermal intensity $(P)$ is decreased, or the travel rate of the thermal beam increased, there is a tendency to exude increasing amounts of oxide in preference to metal. If then, it becomes necessary to employ a reduced rate of energy input, one may reduce the oxide lines to metal at modest temperatures, e.g. 200° C. in the case of copper.

It has further been found that development of a metal pattern, rather than an oxide pattern, may be insured by a rather simple expedient. This involves applying, prior to the thermal writing, an organic, carbonaceous film over the glass substrate, or at least over the portion to be written on. Any form of film or coating may be employed. Thus, cellophane tape, glue, corn oil, paper tape and plastic films, for example, have been successfully applied.

It is our belief that decomposition of the carbonaceous organic, during application of the focused energy, provides a reducing environment. This may either exclude oxygen or, if an oxide forms, reduce the oxide to the metal.

When a metal line, or other writing, is directly exuded from the glass as metal, or subsequently reduced with hydrogen for example, it generally is not electroconductive. This condition is thought to be caused by the rapid dendritic growth character of the metal during exposure to thermal influence.

However, when the metal is exuded under an organic, carbonaceous film or coating, it often is electroconductive. Where that electroconductivity is not of sufficient degree, it may be easily enhanced by an electroless deposition treatment, or by simple electodeposition methods.

Suitable glasses to employ are any glasses known to be capable of thermal exudation of metal oxides, including those noted earlier. In general, alkali borosilicate and aluminosilicate glasses, containing a significant content of the desired metal oxide, are most suitable. We prefer to employ glasses with 1-20 percent metal oxide. Where a laser beam is used in writing, an absorbing oxide may be included in the glass to assist in absorbing sufficient optical energy and converting it to thermal energy.

Any of the transition metals known to exude may be employed. For conductive patterns, copper or silver are preferred. Thus the glass may be a copper aluminosilicate, or may be an alkali borosilicate or aluminosilicate containing copper oxide as an additive. The term "transition metal," as used herein, means a metal selected from among the transition elements.

The thermal beam may be any known source of thermal excitation that can be well focused and of controlled power. We have worked primarily with an argon laser beam. However, any sufficiently intense energy source, that produces local heating at the desired site, can be used to draw lines. This includes other types of lasers, electron beams, high intensity x-rays and well-focused heat guns.

In working with an argon laser, it is frequently desirable, although not a necessity, to include iron oxide $(Fe_2O_3)$, preferably 1-5% by weight, in the glass composition. The $Fe_2O_3$ assists in absorbing the light energy and converting it to thermal energy. While some iron will exude together with copper for example, the amount is relatively small and normally does not alter properties significantly. With other lasers, such as a $CO_2$ laser, oxides other than iron oxide may operate as an absorbent.

In carrying out the inventive method, a glass batch capable of exuding a transition metal is formulated. A selected transition metal may be incorporated in the batch as the oxide. Alternatively, it may be added as a conventional glass making compound that converts to the oxide, for example a carbonate or nitrate. The glass batch, including the metal additive, is then melted, and the melt formed into a substrate of suitable shape.

The substrate may also be produced from the base glass, that is a glass without the metal additive. The metal may then be added by subsequent treatment, for example, ion exchange.

The substrate is mounted in precise manner with relationship to the focused energy source. Either the energy source, or the substrate, usually the former, is then moved along a predetermined path. This path is determined by the desired metal pattern on the substrate. In a production process, the movement may be computer guided.

The process may be carried out in air, with direct metal formation, by selecting a suitable glass and providing the energy source with adequate power and/or rate of travel. Where metal oxide formation is encountered, the oxide may be reduced to the metal in a hydrogen-containing atmosphere, for example, forming gas.

However, for most purposes, the preferred mode is to apply an organic, carbonaceous film or coating to the substrate before applying the thermal influence. This insures metal formation during the thermal processing. Any residue may be readily removed.

Because of the wide range of compositions capable of exuding transition metals, the present method has significant advantages. Through composition variation, we may be capable of matching specific requirements of light absorption, dielectric constant, loss factor, thermal expansion, resistivity, durability and strength.

Radical processing advantages may also be accessible. For example, with at least one family of copper alkali borosilicates, conducting copper metal exudes in vacuo at modest temperatures below 800° C. Oxygen and hydrogen reactants are found necessary for exudation in aluminosilicate systems. Reactant-free exudation may be of critical importance when rigorously clean, in vacuo preparation of electronic devices is necessary.

Finally, thicker metal lines may be built up on the original exuded lines through conventional electrodeposition. Where an original exuded line is not electroconductive, that property may be imparted by electroless deposition. Where the line is electroconductive, as when developed when an organic film, the conductivity may be enhanced by either the electroless or conventional deposition step if necessary. Depositions by this method generally proceed preferentially at metal sites, such as are provided by the thermally drawn patterns of this invention.

Where a glass-ceramic substrate is desired, a thermally crystallizable base glass is selected for substrate formation. After the desired metal pattern has been formed by selective exudation, the substrate may then be completely exposed to a thermal treatment. This causes development of oen or more crystal phases throughout the glass substrate.

SPECIFIC DESCRIPTION

In one illustration of the invention, a copper-exuding, lithium aluminosilicate glass was employed. The glass composition, as calculated in weight percent on an oxide basis, was as follows:

$SiO_2$—52.6
$Al_2O_3$—28.0
$Li_2O$—1.8
$CuO$—13.6
$Fe_2O_3$—4.0

A flat slab, cast from the glass melt, was annealed, and ground and polished. The polished sample was exposed to an argon laser beam (514 nm) of about 75 micron (3 mil) beam width. The beam had a power of 1 watt and was moved across the plate at a rate of 10 cm/sec.

A bright copper line, which appeared to be about 75 microns (3 mil) in width, was observed to develop on the glass surface as the glass was exposed to the laser beam. The sample was then subjected to a series of microprobe analyses across the width of the line. The amount of copper, in atomic percent, observed in each analysis was plotted against pattern width in microns.

As noted earlier, a minor amount of iron is exuded with the copper. If necessary, this could be avoided by omitting $Fe_2O_3$ from the glass and employing another source of energy.

Figure 1:
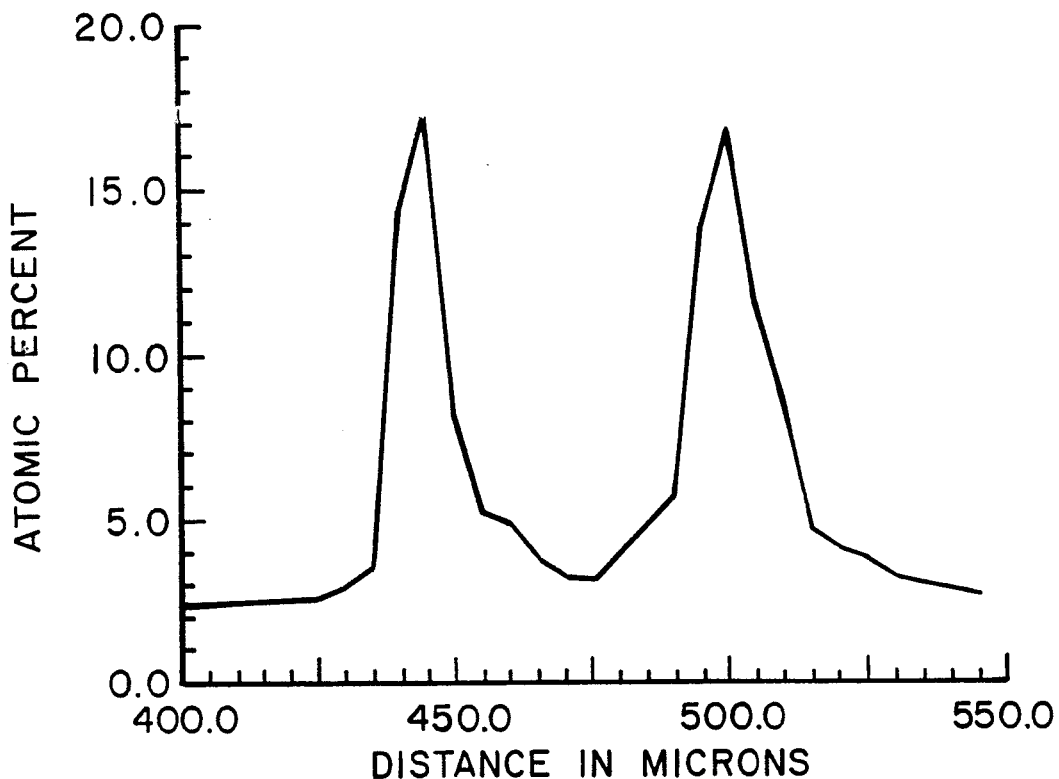
FIG. 1 is a graphical trace showing the copper content observed by microprobe analyses across a thermally exuded copper line drawn in accordance with the invention.

FIG. 1 of the drawing is a graphical presentation of the microprobe data. Copper content is plotted in atomic percent along the vertical axis. The transverse distance, across which analyses were made, is plotted along the horizontal axis in microns.

It will be observed that the graphical depiction indicates two copper peaks, and, hence, essentially two lines of about 15-20 microns width (0.6-0.8 mil) each. This marked variation of copper concentration over the 75 micron (3 mil) beam width reflects the power distribution of, and lack of focus in, the impinging laser beam.

The results suggest that copper line widths are limited by laser resolution rather than glass characteristics.

It may be noted that the microprobe sampling resolution is about 2 microns, (0.08 mil) whereas the copper line formed is less than one micron (0.04 mil) in depth. Hence, a portion of the measurement is of a surface layer on the glass wherein both Cu and O are found. In the initial copper layer, virtually no oxygen is found in the microprobe analysis.

Figure 2:
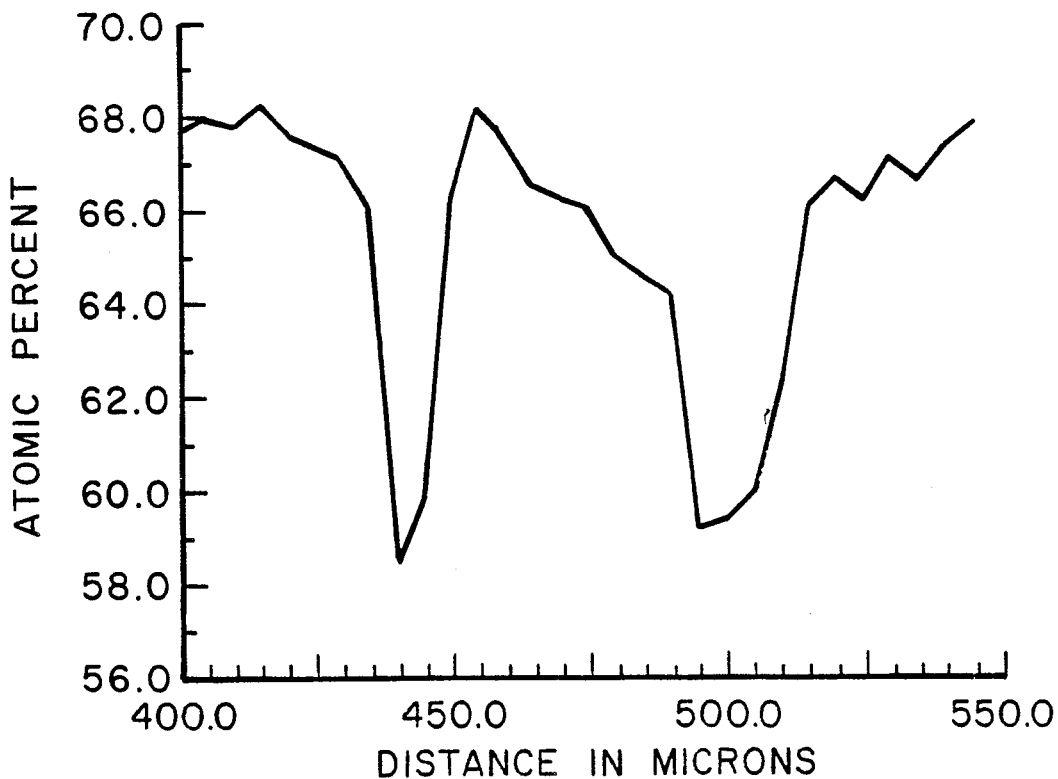
FIG. 2 is a graphical trace, similar to that of FIG. 1, but showing the oxygen contents observed.

FIG. 2 of the drawing is the same as FIG. 1, except that atomic percent oxygen is plotted on the vertical axis. Thus, it might be considered as the reverse of the FIG. 1 data and representation. It may also be considered as confirmation.

By way of further illustration, the same glass was subjected to a variety of laser writing conditions employing the same argon laser. The variable conditions employed, and the resulting characteristics of the lines traced, are set forth in TABLE 1 below wherein, P=laser power in watts
R=travel rate of the beam in centimeters/second (cm/s)
E=absorbed energy in joules/centimeter expressed as Power/Travel Rate
W=line width in microns as measured from photomicrograph at 63×magnification
f=ratio of copper at surface to copper in glass from microprobe
Cu/O=mole ratio of maximum copper to oxygen content at the same point, as shown by microprobe analysis.

TABLE 1

| P(W) | R(cm/s) | E(Joules/cm) | W(u) | f | Cu/O |
|---|---|---|---|---|---|
| 0.05 | 0.01–0.25 | 5–0.20 | none | 1.0 | |
| 0.10 | 0.02–1.00 | 5–0.10 | none | 1.0 | 0.04 |
| 0.20 | 0.10–2.00 | 2–0.10 | none | 1.0 | |
| 0.50 | 0.10 | 5 | 120 | 2.3 | 0.12 |
| | 0.25 | 2 | 68 | 1.6 | 0.06 |
| | 1.00 | 0.5 | 45 | 1.5 | 0.05 |
| | 5.00 | 0.1 | 23 | 1.0 | 0.04 |
| 1.00 | 0.20 | 5 | 150 | 6.2 | 0.34 |
| | 0.50 | 2 | 128 | 7.1 | 0.35 |
| | 2.00 | 0.5 | 113 | 7.2 | 0.31 |
| | 5.00 | 0.2 | 68 | 3.2 | 0.24 |
| | 10.00 | 0.1 | 53 | 2.0 | 0.10 |

The variation in travel rate and energy values in the first three lines indicate that power level was inadequate to cause copper exudation regardless of how slow the beam varying power and rate.

In another exmaple of the invention, electroconductive lines were produced of an optically flat, alkali boroaluminosilicate glass substrate. The calculated glass composition, in weight percent, is:

| | |
|---|---|
| $SiO_2$ | 60.4 |
| $B_2O_3$ | 19.8 |
| $Al_2O_3$ | 7.9 |
| $Li_2O$ | 1.0 |
| $K_2O$ | 0.5 |
| $Fe_2O_3$ | 3.9 |
| $CuO$ | 6.5 |

The substrate was exposed to the argon laser beam, described above, under varying conditions. Copper lines were formed varying in width from 5-50 microns (0.2-2 mils) and a few tenths of a micron in depth.

The copper lines, as formed, were not conductive, a condition thought to be caused by the rapid dendritic growth character of the copper during laser exposure. However, when dipped in an electroless copper plating solution for a few minutes, the lines showed resistance values of 5–100 ohm-cm, while retaining their fine resolution.

Metallic copper lines have also been formed on a copper-exuding glass substrate using a $CO_2$ laser having a light output wavelength of 10,600 nm. The laser was operated with P ranging from 3 to 6 watts, and R ranging from 0.3 to 1.5 cm/sec. It employed an 8 cm (3.2") focal length germanium lens and a 0.075 cm (0.03") output beam diameter. Copper metal lines of 100–300 microns (4–12 mils) in width were obtained. These lines were not electroconductive unless an organic coating in the form of cellophane tape or other common, carbonaceous film overlaid the glass. Electroconductivity was imparted, or enhanced, by dipping in an electroless plating solution as before.

The copper oxide-exuding glass substrates used in these experiments were produced from lithium and sodium aluminosilicates, alkali-free aluminosilicates, and borosilicate base glasses. These glasses did not require an added absorbing oxide, since the 10,600 nm wavelength is strongly absorbed by any glass containing substantial silica.

Similar behavior to the above has been obtained for glasses containing other transition metals. For example, an iron-containing glass, when exposed to $CO_2$ irradiation under conditions similar to the above copper glasses, formed iron lines, particularly when a carbonaceous film in the form of Scotch tape was initially present. Higher power (8 watts) at a 1.5 cm/s raster rate also favored iron line formation. The calculated iron-containing glass composition, in weight percent, is:

| | |
|---|---|
| $SiO_2$ | 68.3 |
| $Al_2O_3$ | 17.7 |
| $Li_2O$ | 3.9 |
| LiCl | 0.4 |
| $TiO_2$ | 4.4 |
| $Fe_2O_3$ | 5.3 |

Virtually identical conditions were used to form cobalt metal lines on a cobalt-exuding glass having this composition in weight percent:

| | |
|---|---|
| $SiO_2$ | 76.0 |
| $B_2O_3$ | 11.8 |
| $Al_2O_3$ | 2.2 |
| $Na_2O$ | 3.8 |
| $Co_3O_4$ | 6.2 |

We claim:

1. An article of manufacture comprising a glass or glass-ceramic substrate containing as a constituent an oxide of a transition metal capable of being exuded onto the surface of said substrate under thermal influence, said substrate having a portion of its surface coated with said transition metal and a portion of the surface free of such metal, the coated portion of the surface corresponding to a predetermined pattern, and said pattern extending into the substrate only under the metal pattern as a zone of diminished metal content relative to the metal content in the adjacent uncoated zone.

2. An article in accordance with claim 1 wherein said exuded transition metal is selected from the group composed of copper, iron and cobalt.

3. An article in accordance with claim 1 wherein the thermally written pattern is composed of spatially separated metal lines.

4. An article in accordance with claim 3 wherein said metal lines are electroconductive.

5. An article in accordance with claim 4 wherein said metal is copper.

6. An article in accordance with claim 3 wherein the lines are less than 2 mils in width.

7. An article in accordance with claim 4 wherein said metal lines interconnect leads in microcircuitry.

8. A method of producing a desired metallic pattern of a selected transition metal on the surface of a glass or glass-ceramic substrate which comprises the steps of:
   (a) providing a glass substrate having a composition containing an oxide of said selected transition metal and which is capable of exuding said selected transition metal onto the surface of said glass when subjected to thermal influence; and then
   (b) applying an intense, well-focused source of energy onto the surface of said glass substrate in a pattern corresponding to the desired metallic pattern, the intensity of the source of energy applied being such as to develop sufficient localized heating within the surface of said glass substrate to cause said selected transition metal to exude onto the surface of said glass substrate in said desired metallic pattern.

9. A method in accordance with claim 8 wherein said transition metal is selected from the group consisting of copper, cobalt, and iron.

10. A method in accordance with claim 8 wherein said glass is a borosilicate or an aluminosilicate.

11. A method in accordance with claim 8 wherein the amount of said oxide of said selected transition metal in the glass composition is 1–20% by weight.

12. A method in accordance with claim 8 wherein said energy source is a laser beam, and the glass additionally contains a metal oxide absorbent for the optical energy of that laser beam.

13. A method in accordance with claim 12 wherein said energy source is an argon laser having a power level greater than 0.20 watts and a travel rate of 0.10 to 10 cm./second, and said absorbent is iron oxide.

14. A method in accordance with claim 13 wherein the content of iron oxide is 1 – 5%.

15. A method in accordance with claim 12 wherein said energy source is a $CO_2$ laser, and said absorbent is a silicate glass that absorbs the optical energy.

16. A method in accordance with claim 8 wherein said transition metal exudes in the presence of oxygen and remains essentially unoxidized.

17. A method in accordance with claim 8 wherein said glass substrate provided is composed of a thermally crystallizable base glass, a transition metal pattern is exuded on its surface, and the patterned glass substrate is exposed to a thermal treatment that develops one or more crystal phases throughout the glass substrate.

18. A method in accordance with claim 8 wherein at least that portion of said glass substrate, upon which said transition metal pattern is to be produced by applying a source of energy, is covered with an organic, carbonaceous material before applying said source of energy.

19. A method in accordance with claim 18 wherein said organic carbonaceous material is selected from the group consisting of tapes, plastic films, glue and corn oil.

20. A method in accordance with claim 8 wherein said source of energy is applied through an organic, carbonaceous material.

21. A method in accordance with claim 8 wherein said exuded metal exists at least in part as an oxide, and the pattern is subjected to a reducing atmosphere to reduce the oxide to metal.

22. A method in accordance with claim 21 wherein said reducing atmosphere contains hydrogen.

23. A method in accordance with claim 8 wherein said substrate glass is a borosilicate, and said localized heating takes place in a vacuum.

24. A method in accordance with claim 8 wherein said substrate, with a metal pattern thereon, is exposed to electroless deposition or electrodeposition to impart or enhance electroconductivity in the pattern.

25. A method in accordance with claim 24 wherein said metal is copper.

26. A method of thermal writing with a selected transition metal on the surface of a glass substrate which comprises the steps of:
(a) providing a glass substrate having a composition containing an oxide of said selected transition metal and which is capable of exuding said selected transition metal onto the surface of said glass when subjected to thermal influence; and then
(b) applying an intense, well-focused source of energy onto the surface of said glass substrate along a path corresponding to the desired metallic writing, the intensity of the source of energy applied being such as to develop sufficient localized heating within the surface of said glass substrate to cause said selected transition metal to exude onto the surface of said glass substrate in said desired metallic writing.

27. A method in accordance with claim 26 wherein said source of energy is applied through an organic, carbonaceous material.

28. A method in accordance with claim 26 wherein said transition metal is selected from the group consisting of copper, cobalt and iron.

29. An article of manufacture comprising a glass or glass-ceramic substrate containing as a constituent an oxide of a transition metal capable of being exuded onto the surface of said substrate, and also containing a metal oxide absorbent for the optical energy of a laser beam, said substrate having a portion of its surface coated with said transition metal and a portion of the surface free of such metal, the coated portion of the surface corresponding to a predetermined pattern, and said pattern extending into the substrate only under the metal pattern as a zone of diminished metal content relative to the metal content in the adjacent uncoated zone.

30. An article in accordance with claim 29 wherein said absorbent is iron oxide.

31. An article in accordance with claim 29 wherein said absorbent is a silicate glass.

* * * * *

UNITED STATES PATENT AND TRADEMARK OFFICE
CERTIFICATE OF CORRECTION

PATENT NO.   :   4,847,138
DATED        :   July 11, 1989
INVENTOR(S)  :   Elizabeth A. Boylan and Gerald D. Fong It is certified that error appears in the above-identified patent and that said Letters Patent is hereby corrected as shown below:

Column 1, line 30, "require" should read --requires--.

Column 2, line 26, "iinvolving" should read --involving--.

Column 2, line 61, "of" should read --on--.

Column 3, lines 57 and 58, "electodeposition" should read --electrodeposition--.

Column 5, line 19, "oen" should read --one--.

Column 6, line 49, insert between "beam" and "varying": --traveled. The remaining data illustrate the effects of--.

Column 6, line 50, "exmaple" should read --example--.

Column 6, line 51, "of" should read --on--.

Signed and Sealed this

Twenty-ninth Day of May, 1990

*Attest:*

HARRY F. MANBECK, JR.

*Attesting Officer*   *Commissioner of Patents and Trademarks*